(12) United States Patent
Kitano et al.

(10) Patent No.: US 12,045,972 B2
(45) Date of Patent: Jul. 23, 2024

(54) VIDEO CONFIRMATION COMPUTER

(71) Applicant: KAWASAKI JUKOGYO KABUSHIKI KAISHA, Kobe (JP)

(72) Inventors: Shinya Kitano, Kobe (JP); Atsushi Nakaya, Kobe (JP); Masaya Yoshida, Kobe (JP); Kazuo Fujimori, Kobe (JP); Hiroyuki Okada, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 63 days.

(21) Appl. No.: 17/783,297

(22) PCT Filed: Dec. 4, 2020

(86) PCT No.: PCT/JP2020/045186
§ 371 (c)(1),
(2) Date: Jun. 8, 2022

(87) PCT Pub. No.: WO2021/117619
PCT Pub. Date: Jun. 17, 2021

(65) Prior Publication Data
US 2023/0019019 A1    Jan. 19, 2023

(30) Foreign Application Priority Data

Dec. 10, 2019  (JP) .................................. 2019-222900
Jun. 8, 2020   (JP) .................................. 2020-099458

(51) Int. Cl.
*G06T 7/00*   (2017.01)
*G06F 3/04847*  (2022.01)
*G06T 11/00*  (2006.01)

(52) U.S. Cl.
CPC ........ *G06T 7/0004* (2013.01); *G06F 3/04847* (2013.01); *G06T 11/00* (2013.01); *G06T 2207/30148* (2013.01)

(58) Field of Classification Search
None
See application file for complete search history.

(56) References Cited

U.S. PATENT DOCUMENTS

2007/0168068 A1   7/2007  Saito
2008/0025824 A1   1/2008  Hashimoto
2021/0252713 A1*  8/2021  Mimura ................. B25J 9/1697

FOREIGN PATENT DOCUMENTS

CN      110303491 A      10/2019
JP      2004-031381 A    1/2004
(Continued)

*Primary Examiner* — Tapas Mazumder
(74) *Attorney, Agent, or Firm* — METROLEX IP LAW GROUP, PLLC; Robert L. Scott, Esq.

(57) ABSTRACT

A video confirmation computer for confirming video related to robot operation includes a storage unit and a processor. The storage unit stores information on the position of the electric motor that drives a link body of the robot received from the controller of the robot and information on the video obtained by a camera attached to the robot. The processor makes at least one of the video confirmation computer itself and a computer connected to the video confirmation computer display a model area and a video area side by side. In the model area, a two-dimensional or three-dimensional model reproducing the posture of the robot is displayed by computer graphics. In the video area, the video is displayed.

5 Claims, 7 Drawing Sheets

(56) References Cited

FOREIGN PATENT DOCUMENTS

| | | |
|---|---|---|
| JP | 2008-28134 A | 2/2008 |
| JP | 2017-052053 A | 3/2017 |
| JP | 2019-171490 A | 10/2019 |
| KR | 10-2007-0013284 A | 1/2007 |

* cited by examiner

VIDEO CONFIRMATION COMPUTER

TECHNICAL FIELD

This invention relates to a video confirmation computer for confirming a video of operation performed by a robot.

BACKGROUND ART

Conventionally, robots have been used, for example, to transport wafers and other substrates. The robot of PTL 1 includes a controller for controlling the motion of the robot.

PRIOR-ART DOCUMENTS

Patent Documents

PTL 1: Japanese Patent Application Laid-Open No. 2008-28134

SUMMARY OF THE INVENTION

Problems to be Solved by the Invention

The robot may generate an error for various reasons. In this case, maintenance work must be performed according to the error that occurs. In order to achieve a high level of information management in wafer processing facilities or the like, data transfer to another location or communication with an external network is often restricted. In this situation, there is a need to be able to quickly identify and resolve the cause of a robot error.

The present invention is made in view of the circumstances described above, and an object of the present invention is to enable the operator to quickly and well understand the situation when, for example, a robot error occurs.

Means for Solving the Problems

The problem to be solved by the present invention is as described above, and next, means for solving the problem and effects thereof will be described.

According to an aspect of the present invention, a video confirmation computer having the following configuration is provided. That is, this video confirmation computer is used to confirm a video of operation performed by a robot. The video confirmation computer includes a storage unit and a processor. The storage unit is capable of storing information. The processor outputs information based on stored contents of the storage unit. The storage unit stores information of a position of an electric motor and information of the video. The electric motor drives a link body of the robot. The information of the position of the electric motor is received from the controller of the robot. The information of the video is obtained by a camera attached to the robot. The processor makes at least one of the video confirmation computer itself and a computer connected to the video confirmation computer display a model area and a video area side by side. In the model area, a two-dimensional or three-dimensional model reproducing a posture of the robot is displayed by computer graphics. In the video area, the video is displayed.

The two areas are displayed side by side in such a way, therefore, the operator can understand the situation regarding the operation of the robot in a composite and intuitive manner Thus, the operator can handle the situation smoothly and accurately.

Effects of the Invention

According to the invention, for example, in the event of a robot error, the operator can grasp the situation quickly and well.

EMBODIMENT FOR CARRYING OUT THE INVENTION

Figure 1:
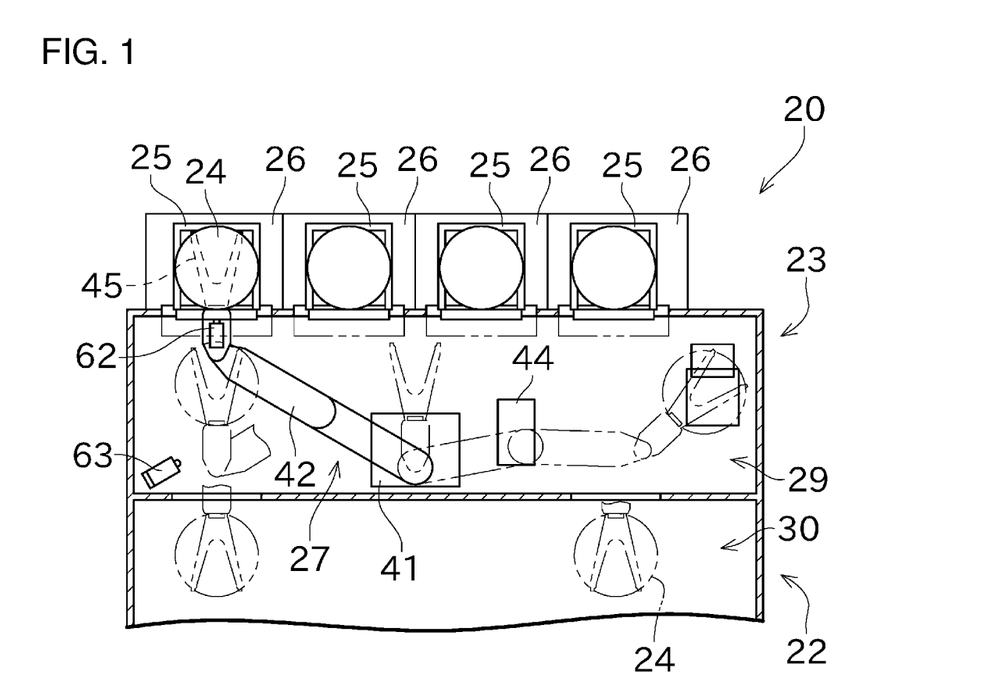
FIG. 1 is a planar cross-sectional view showing a portion of a semiconductor processing facility to which a video confirmation computer according to an embodiment of the present invention is applied.
Figure 2:
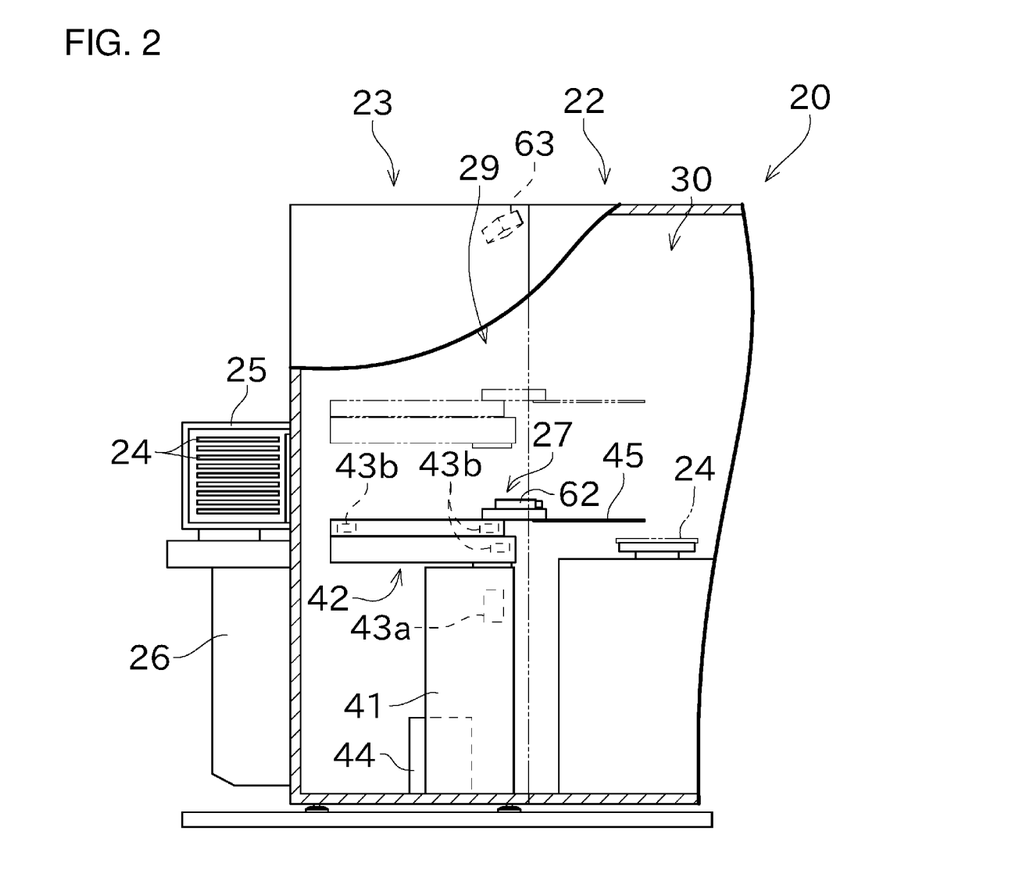
FIG. 2 is a side cross-sectional view showing a portion of the semiconductor processing facility being cut.

Next, the embodiment of the invention will be described with reference to the drawings. FIG. 1 is a planar cross-sectional view showing a portion of a semiconductor processing facility 20 to which an embodiment of the present invention is applied. FIG. 2 is a side cross-sectional view showing a portion of the semiconductor processing facility 20 being cut. FIG. 1 and FIG. 2 show a robot 27 in various states of motion with two dotted chain lines.

The semiconductor processing facility 20 applies predetermined processing to a wafer 24, which is the substrate to be processed. In this embodiment, the wafer 24 is a semiconductor wafer. Various processing can be applied to the wafer 24, such as heat process, impurity introduction process, thin film formation process, lithography process, cleaning process, or planarization process. Substrate processing other than the above-described substrate processing may be performed in the semiconductor processing facility 20.

The semiconductor processing facility 20 includes a wafer processing device 22 and a wafer transfer device 23. The semiconductor processing facility 20 is a facility predetermined by, for example, the SEMI standard. SEMI is an abbreviation for the Semiconductor Equipment and Materials International. In this case, for example, a hoop 25 and a hoop opener 26 for opening and closing the hoop 25 follow the SEMI standards E47.1, E 15.1, E57, E62, E63, E84, or other specifications. However, the configuration of the semiconductor processing facility 20 may differ from the SEMI standard.

In the wafer processing device 22, a processing space 30 that is filled with a predetermined gas is formed. The wafer processing device 22 applies the processing described above to the wafer 24 in the processing space 30. The wafer processing device 22 includes, in addition to a main body of the processing device that applies processing to the wafer 24, a processing space forming unit that forms the processing space 30, a wafer transportation unit that transports the wafer 24 in the processing space 30, and a regulating device that regulates the atmospheric gas filled in the processing space 30. The regulating device is realized by a fan filter unit or the like.

The wafer transfer device 23 takes the wafer 24 before processing out from the hoop 25 and supplies it to the wafer processing device 22. The wafer transfer device 23 takes the wafer 24 after processing out from the wafer processing device 22 and houses it into the hoop 25 again. The wafer transfer device 23 functions as a front-end module device (Equipment Front End Module; EFEM). In the semiconductor processing facility 20, the wafer transfer device 23 serves as an interface unit that transfers the wafer 24 between the hoop 25 and the wafer processing device 22. The wafer 24 is transferred between the space in the hoop 25 and the processing space 30 in the wafer processing device 22 while moving through a preparation space 29 with a high cleanliness level that is filled with a predetermined atmospheric gas.

The preparation space 29 is a closed space where contamination control is performed. In the preparation space 29, suspended microparticles in the air are controlled below a limited cleanliness level, and environmental conditions such as temperature, humidity, and pressure are controlled as necessary. In this embodiment, the processing space 30 and the preparation space 29 are maintained at a specified cleanliness level so as not to adversely affect the processing of the wafer 24. For this cleanliness level, for example, the CLASS 1 specified by the ISO (International Organization for Standardization) is used.

The robot 27 functions as a wafer transfer robot. In this embodiment, the robot 27 is realized by a SCARA type horizontal articulated robot. SCARA is an abbreviation for Selective Compliance Assembly Robot Arm. The robot 27 is located in the preparation space 29.

As shown in FIG. 2 and the like, the robot 27 includes a base 41, a robot arm 42, a vertical drive actuator 43*a*, a horizontal drive actuator 43*b*, and a controller 44.

The base 41 functions as a base member to support the robot arm 42. The robot arm 42 is attached to the top surface of the base 41.

The robot arm 42 includes a link structure with a plurality of link bodies that are connected sequentially in a direction from a base end to a tip end. A robot hand 45 is provided at the tip end of the robot arm 42. The robot hand 45 can hold and release the wafer 24. There are various methods of holding the wafer 24 by the robot hand 45, for example, placing the wafer 24 on top of the robot hand 45, clamping the wafer 24 by the robot hand 45, suctioning the wafer 24 to the robot hand 45 by negative pressure, and the like.

The vertical drive actuator 43*a* displaces the robot arm 42 in a vertical direction. The vertical drive actuator 43*a* is configured as an electric motor, for example. By moving the robot arm 42 in the vertical direction, the height position of the robot hand 45 can be changed.

The horizontal drive actuator 43*b* rotates each of the link bodies of the robot arm 42 individually about corresponding joint axes. The horizontal drive actuator 43*b* is configured as an electric motor, for example. Rotation of each link body about the vertical joint axis allows the robot hand 45 to move in a horizontal plane.

Figure 3:
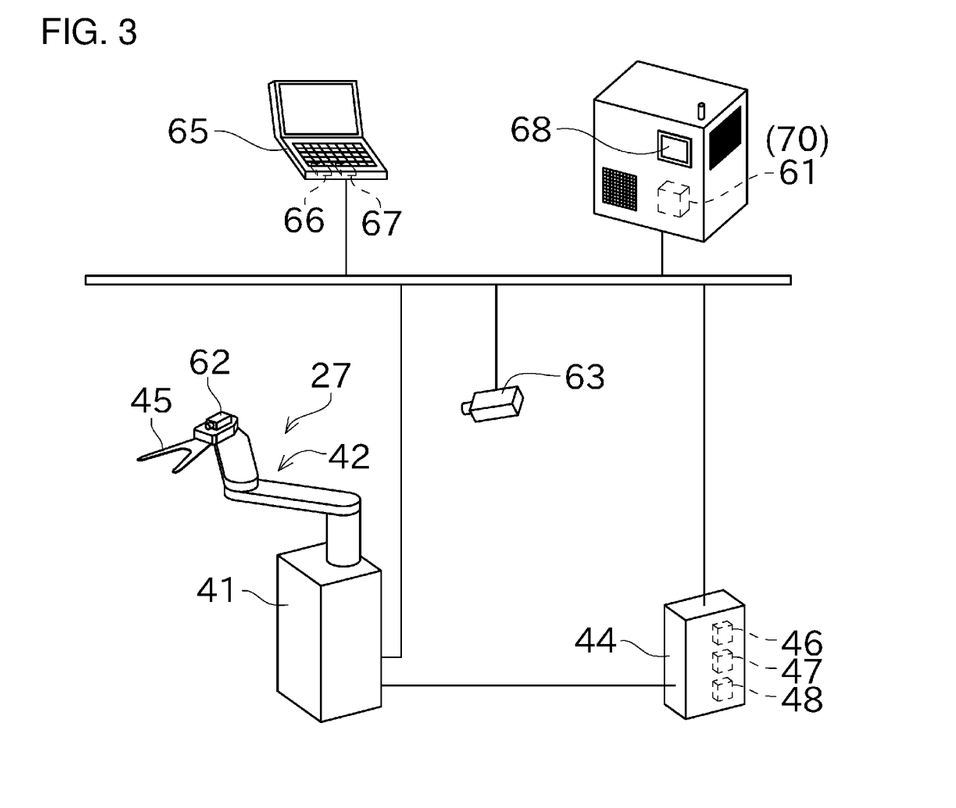
FIG. 3 is a schematic diagram illustrating a communication network constructed in a semiconductor processing facility.

The controller 44 controls the vertical drive actuator 43*a* and the horizontal drive actuator 43*b* to move the robot hand 45 to a predetermined position. The controller 44 includes, as shown in FIG. 3, a storage circuit 46, a computing circuit 47, and an output device 48. The storage circuit 46 stores the predetermined program and various data. The computing circuit 47 performs arithmetic processing in accordance with the program. The output device 48 outputs control signals to the vertical drive actuator 43*a* and the horizontal drive actuator 43*b* based on the computing results of the computing circuit 47. The storage circuit 46 is realized by, for example, a RAM, a ROM, and an HDD, etc. The computing circuit 47 is realized by, for example, a CPU.

As shown in FIG. 3, the semiconductor processing facility 20 includes a higher-level controller 61. The higher-level controller 61 transmits commands for executing the semiconductor processing process to various devices included in the semiconductor processing facility 20.

The higher-level controller 61 is wired or wirelessly connected to the controller 44 described above provided by the robot 27. The higher-level controller 61 sends commands to the controller 44 so that the robot 27 performs the necessary operation at the necessary timing. The controller 44 controls the robot 27 according to the commands received from the higher-level controller 61.

If any error occurs, the controller 44 transmits information regarding the error to the higher-level controller 61. The program for the controller 44 to control the robot 27 includes a plurality of modules. Here, a module is a portion of the program for realizing a certain unit of operation by the robot 27. The units of operation may include, for example, operation of placing the wafer 24 held by the robot hand 45 at a predetermined position, operation of holding the placed wafer 24 by the robot hand 45, and the like, but not limited to.

The vertical drive actuator 43*a* and the horizontal drive actuator 43*b* are each configured as an electric motor. The electric motor is of a known configuration and includes a motor drive circuit, a motor main body, a rotational position sensor, and a current sensor, which are not shown. The motor main body includes a stator, a rotor, and an output shaft. The controller 44 supplies current to a motor drive circuit through a power circuit so that the electric motor performs the desired operation. As a result, the output shaft of the electric motor rotates according to the flowing current.

The current flowing in the motor drive circuit is determined by the target value of the operation of the electric motor and the detected value of the operation. The target value of the operation of the electric motor can be, for example, a target value for rotational position, rotational speed, or rotational acceleration. The detected value can likewise be, for example, a detected value for rotational position, rotational speed, or rotational acceleration. In controlling the current flowing in the motor drive circuit, control laws such as feedback control laws or adaptive control laws may be used.

In the robot arm 42, a camera 62 is fixed to the link body to which the robot hand 45 is fixed. As shown in FIG. 3, this camera 62 is connected via a network to a video confirmation computer 65. The video confirmation computer 65 can be, for example, a mobile terminal, a personal computer, or the like.

The semiconductor processing facility 20 includes a camera 63 for taking a video of the robot 27. The camera 63 is wired or wirelessly connected to the controller 44.

If some abnormality occurs in the robot 27 and a need for troubleshooting arises, the operator can operate some kind of computer to obtain information for handling. This computer may be referred to as a handling computer 70. In this embodiment, the higher-level controller 61 serves as the handling computer 70.

The video confirmation computer 65 includes a storage circuit (storage unit) 66 and a computing circuit (processor) 67. The storage circuit 66 is realized by, for example, a RAM, a ROM and an HDD, etc. The computing circuit 67 is realized by, for example, a CPU.

For example, the information shown in (1) to (6) below is stored in the storage circuit 66 of the video confirmation computer 65 and the storage circuit 46 of the controller 44 (hereinafter simply referred to as the storage circuit). This storage operation may be performed continuously or discretely at intervals.

(1) Information about the images captured by cameras 62 and 63
(2) Information about the signals received by the controller 44 from the higher-level controller 61 and the signals sent by the controller 44 to the higher-level controller 61 (communication log information)
(3) Information about the program executed by the controller 44 to control the robot 27
(4) Information about the current value, position, speed, acceleration (including negative acceleration, the same hereinafter), position deviation, velocity deviation, and acceleration deviation of the electric motor provided in the robot 27
(5) Information about the output signals from various sensors (for example, light emitting/shading sensor, piston position sensor of pneumatic actuator, pressure sensor, valve position sensor of solenoid valve) provided in the robot 27
(6) Information about input signals to various devices (for example, solenoid valve) provided in the robot 27

Here, the current value of the electric motor is detected by a current sensor installed in the motor drive circuit. The position of the electric motor can be obtained based on the detection of the rotational position sensor installed in the electric motor. The speed and acceleration of the electric motor can be obtained by differentiating the detected values of the rotational position sensor with time. The position deviation, speed deviation, and acceleration deviation can be obtained by calculating the difference between the above-described position, speed, and acceleration and the target position, target speed, and target acceleration.

A web server application and a database application are previously installed in the controller 44 and the program is stored in the storage circuit 46 described above.

Figure 4:
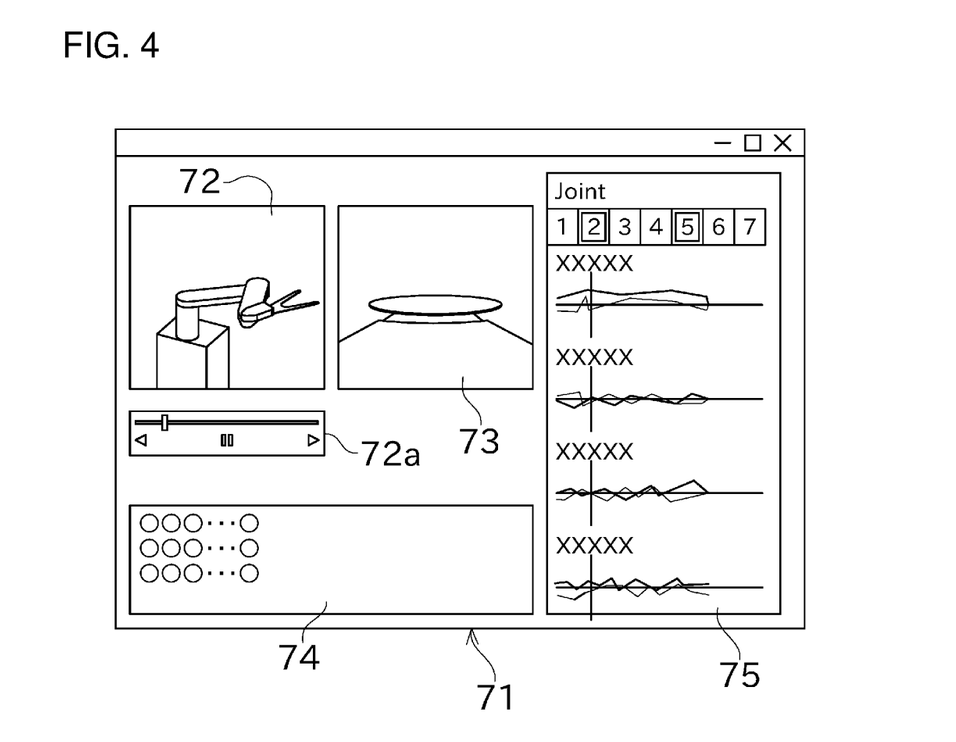
FIG. 4 is a diagram showing a display example of a status confirmation screen displayed on a video confirmation computer.

By the way, if for some reason, an error may occur in the robot 27. In this case, the video confirmation computer 65 can display a status confirmation screen 71 as shown in FIG. 4, based on contents stored in the storage circuit 66. This status confirmation screen 71 includes a model area 72, a video area 73, a log area 74 and a graph area 75.

In the model area 72, a two-dimensional or three-dimensional model reproducing the posture of the robot 27 at a certain point in time is displayed by computer graphics. The posture of the displayed model is calculated based on the positions of the motors stored in the storage circuit 66. A seek bar 72a is located at the bottom of the model area 72. In this seek bar 72a, a slider, a play button, a pause button, and a reverse play button are arranged. This allows, in the display of the model area 72, the operation of the robot 27 to be reproduced or stopped at a certain point in time. Even when, for example, the real robot 27 is in a position where it is hidden from the camera 63 and cannot be captured, the operator can easily understand what posture the robot 27 was in by referring display contents on the model area 72.

In the video area 73, the captured image obtained by the camera 62 and stored in the storage circuit 66 is displayed. The play position of the image can be specified by the seek bar 72a. Thus, the reproduction of the model operation in the model area 72 and the play of the video in the video area 73 can be synchronized.

In the log area 74, a communication log stored in the storage circuit 66 is displayed. Information about the program executed to control the robot 27 may be displayed on the log area 74.

In the graph area 75, information about the electric motor current value, position, speed, acceleration, position deviation, speed deviation, and acceleration deviation stored in the storage circuit 66 are displayed in different colored graphs. In the example shown in FIG. 4, a line graph is displayed with each value on the vertical axis and time on the horizontal axis. A vertical straight line (time graphic) is displayed on each graph in the graph area 75. The position of this line corresponds to the time of the moment displayed on the model area 72 and the video area 73.

When some error occurs in the robot 27, the information stored in the storage circuit 66 within a predetermined time range including the time of the error (for example, from a several seconds before the time of the error to a several seconds after the time of the error) is the target of display on the status confirmation screen 71.

When the play button is pressed on the seek bar 72a, the information to be displayed is played on the model area 72 and the video area 73. Similarly, when the reverse play button is pressed, the information to be displayed is played in reverse. When the pause button is pressed, the play/reverse play is paused, and when the pause button is pressed again, the pause is released. The seek bar 72a may include buttons for performing known fast forward/rewind operation.

When the information to be displayed is played, the reproduced motion of the robot 27 is displayed on the model area 72, and the captured images by the camera 62 are displayed dynamically on the video area 73. During play, the communication log is displayed on the log area 74 and a graph is displayed on the graph area 75. In the log area 74, the log history at the time indicated by the seek bar 72a is displayed. This log history is appended moment by moment in synchronization with play. In the graph area 75, the above-described time graphic in each graph moves horizontally in synchronization with play.

The above configuration allows, when an error occurs, the operator to quickly identify and handle the cause of the error from various perspectives by operating the video confirmation computer 65.

In the above example, the information stored in the storage circuit 66 in the predetermined time range before and after the error occurred is the target for display on the status confirmation screen 71. Alternatively, the information stored for the unit of operation or the module that was being executed in the controller 44 at the time the error occurred may be the target for display on the status confirmation screen 71.

The model area 72 and the video area 73 are arranged side by side in the same status confirmation screen 71 so that they are in close proximity to each other. Thus, the information in the two areas allows the operator to understand the situation in which the error occurred in a composite and intuitive manner.

The overall situation of the robot 27 is obtained from the model area 72, and the detailed situation around the tip of the robot hand 45 is obtained from the video area 73. Thus, the information of the two-dimensional or three-dimensional model displayed on the model area 72 and the information of the captured video displayed on the video area 73 can be complementary to each other. In this sense, it is advantageous for both video to be displayed side by side.

In addition, the appending of the log history in the log area 74 is done at a timing that matches the time related to the display on the model area 72 and the video area 73. Therefore, there is no confusion for the operator in understanding the situation.

Since the model area 72 and the video area 73 are arranged adjacent to each other, it is easier for the operator to grasp the model video and the captured image as integral information. Therefore, it is possible to realize a configuration which does not cause discomfort even if the video in the video area 73 is played/stopped by the seek bar 72a in the model area 72.

In the example of FIG. 4, the model area 72 and the video area 73 are arranged so that the model area 72 is on the left and the video area 73 is on the right. However, the arrangement may be reversed to the left and right. Also, the model area 72 and the video area 73 can be arranged side by side vertically.

Figure 5:
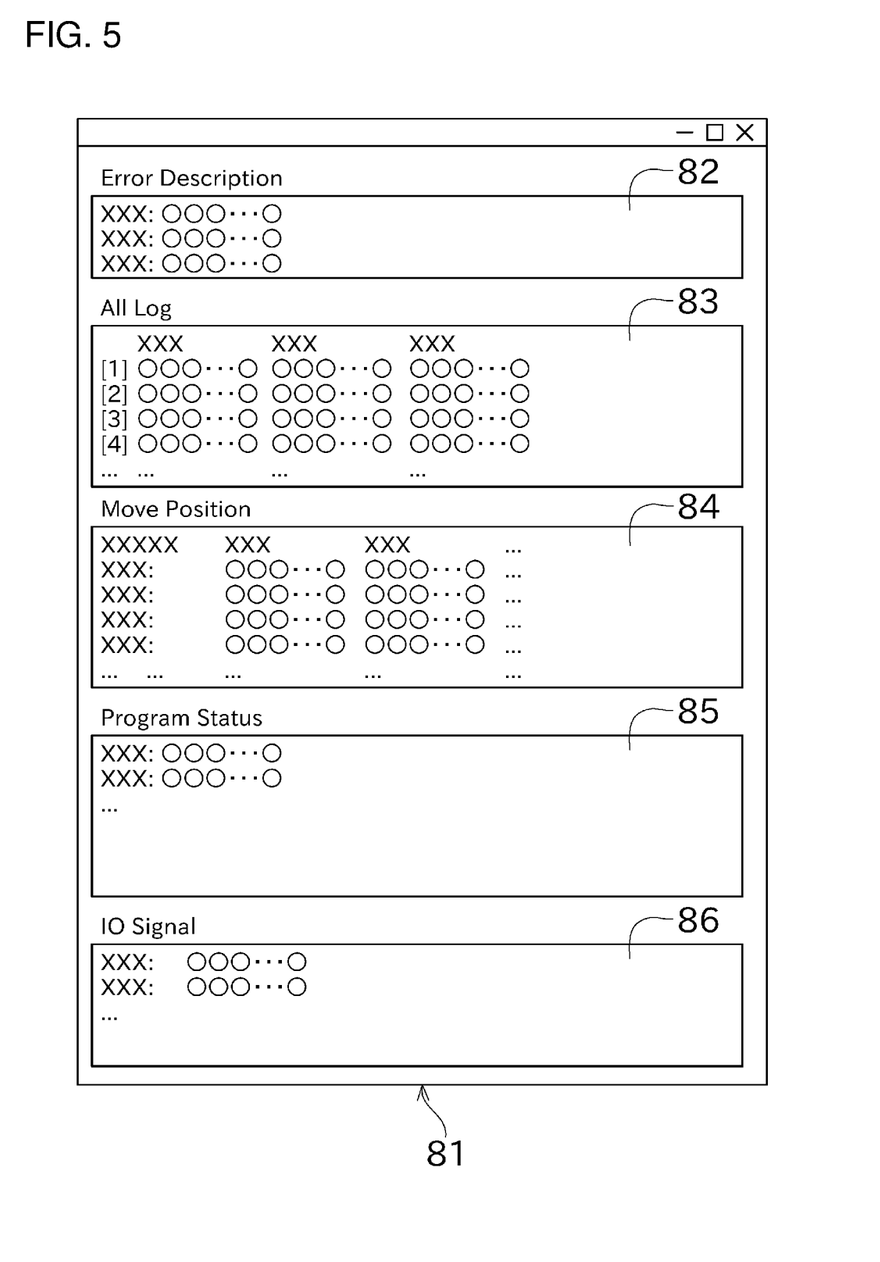
FIG. 5 is a diagram illustrating a display example of a log analysis screen displayed on a handling computer.

Next, with reference to FIG. 5, the log analysis screen 81 that the controller 44 can be displayed on the display of the handling computer 70 (for example, a display 68 shown in FIG. 3) will be described.

When some error occurs in the robot 27, the communication log describing the contents of the communication before and after that point in time is highly valuable information for identifying the cause of the error, etc. However, the communication log generally include both those that have high relevance to the error and those that have low relevance to the error, and in many cases, those that have low relevance to the error make up the majority of the communication log. Thus, those with high relevance to the error may be buried elsewhere, making them difficult to find.

Accordingly, in this embodiment, in the log analysis screen 81 that the controller 44 outputs to the handling computer 70, has a function which extracts and displays items that are highly relevant to the error among items in the communication log. This facilitates the identification of the cause of the error and its handling. The handling computer 70 functions as a terminal to the controller 44.

Specifically, a communication code indicating the type of communication is described for each line of the communication log. In the storage circuit 46 of the controller 44, information of communication codes that are highly relevant to errors in the communication log is previously stored so that the information of communication codes is in association with information identifying the type of error (for example, error code). When extraction of the communication log is indicated by the operator, the communication log is filtered and output from the controller 44 to the handling computer 70, so that only those types of the communication log that are highly relevant to the error code are displayed.

When the controller 44 displays the communication log in such a filtered form on the handling computer 70, for example, the following (1) through (5) may be displayed at the same time. This log analysis screen 81 allows the operator to more easily understand the situation.

(1) An error description area 82. Display contents in the error description area 82 include, for example, the date and time of the error, the error code, and a summary of the error.

(2) A detailed log area 83. Display contents in the detailed log area 83 include the communication log extracted as described above from a predetermined time before the error occurred to the point in time when the error occurred.

(3) An operation position area 84. The operating position area 84 can display numerical values indicating the posture of the robot 27 at the time the error occurred, in the form of a detected position or target value of the electric motor.

(4) A program status area 85. The program status area 85 displays information for identifying the module that was executed to control the robot 27 according to the communication log displayed on the detailed log area 83. However, each line of the communication log may be selectable in the detailed log area 83, and the program corresponding to the selected line of the log may be displayed on the program status area 85.

(5) An input/output signal area 86. The input/output signal area 86 displays output signals from various sensors that the robot 27 has and input signals to various devices.

Figure 6:
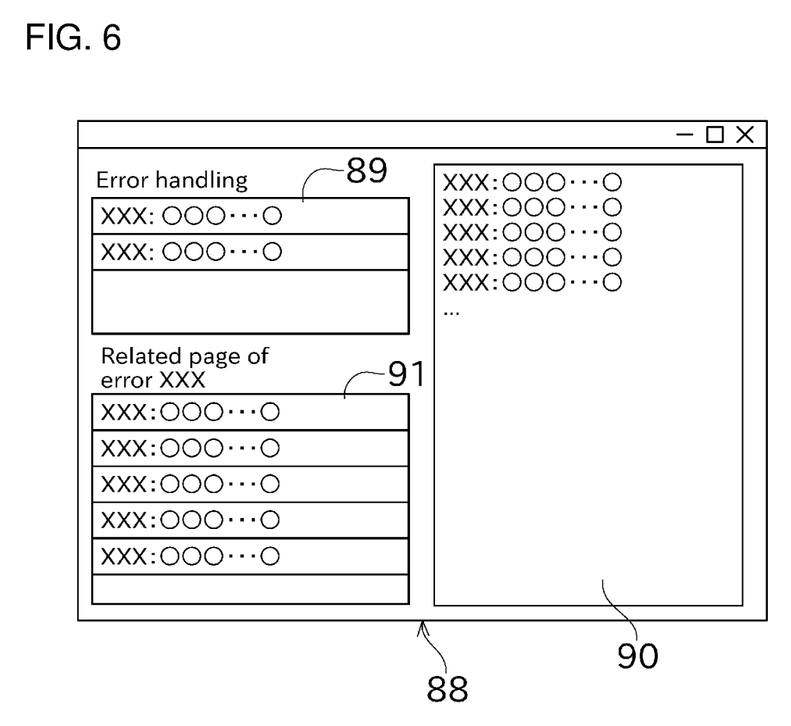
FIG. 6 is a diagram showing a display example of an error handling support screen.

Next, the error handling support screen 88, which can be displayed by the handling computer 70, will be described with reference to FIG. 6.

The storage circuit 46 of the controller 44 stores data indicating how to handle with the case that some error occurs in the robot 27. This handling method is output from the controller 44 to the handling computer 70 and displayed on a display (for example, the display 68 shown in FIG. 3) to assist the operator in dealing with the error.

Contents displayed on the display 68 to assist the work in handling the error can be, for example, the following (1) through (3).

(1) An error description area 89. The error description area 89 displays the date and time the error occurred, the error code, and the like. In the error description area 89, errors that occurred within a predetermined past time from the time of the most recent error occurrence or errors that occurred a predetermined number of times in the past from the time of the most recent error occurrence may be selectively displayed. Hereafter, the past errors displayed on the error description area 89 may be referred to as the error history.

(2) A handling contents description area (detailed description area) 90. In the handling contents description area 90, the handling method corresponding to the error that is the target of description in the error description area 89 is displayed in detail. The handling method is previously created corresponding to the error code by the manufacturer of the robot 27, and is stored in the storage circuit 46 of the controller 44 in the form of appropriate electronic data such as HTML data, image data, video data, PDF data, etc. When an error history is selected in the error description area 89, a method of handling corresponding the error history may be displayed on the handling contents description area 90. The video data can be, for example, data captured by the camera 63 of the robot 27 when an error occurred in the past.

(3) A related items list area 91. The related items list area 91 displays a list of items related to the error described in the error description area 89. When an error history is selected in the error description area 89, the items related to that error history may be displayed on the related items list area 91. The list consists of one or more related items. The related items can be, for example, the following (a) or (b).

(a) A record of work performed in the past in response to the current error or the selected error history. When an error occurs, the operator can make the work record creation screen be displayed on the display 68 by operating the appropriate user interface device. This interface can be, for example, a touch panel integrated with the display 68, or hardware keys located near the display 68, but however, it is not limited to. On the work record creation screen, the operator can create a work record by specifying the error code, error occurrence date and time, work date and time, operator, contents of work and results, title of the work record, importance of the work record, or the like. The work record which the operator inputs into the handling computer 70 is transmitted from the handling computer 70 to the controller 44. Upon receiving the work record data, the controller 44 stores the work record in the storage circuit 46 in association with the error code. In the related items list area 91, for example, the importance and title of the work record are displayed.

(b) An error associated with the current error or the selected error history. The associated error includes, for example, other errors that may occur simultaneously with an error and other errors that occur as a result of the occurrence of an error, but is not limited to. Associations between errors are created previously by the manufacturer of the robot 27 and stored in the storage circuit 46 of the controller 44. Associations between errors may be configured to be registered in the storage circuit 46 by operation of the operator. The related items list area 91 displays, for example, the error code.

By operating the user interface device described above as appropriate, the operator may select the related item displayed in the related items list area 91 as appropriate. Information on the selected related item is transmitted from the handling computer 70 to the controller 44. The controller 44 transmits various data to the handling computer 70 so that, when a work record is selected, the contents of that work record are displayed in the handling contents description area 90, and when an associated error is selected, how to handle that error is displayed in the handling contents description area 90.

Although a plurality of related items can be displayed in the related items list area 91, the controller 44 can control the handling computer 70 to sort and display the related items so that the related item with the highest priority is at the top and the related item with the lowest priority is at the bottom. FIG. 6 shows the related items sorted according to priority in the related items list area 91. The priority can be determined based on, for example, the frequency of occurrence of the error, the frequency with which the description screen is displayed, the importance specified in the work record, and the relevance determined from the current sensor and position sensor detection values when the error occurs. If multiple perspectives are used to determine the priority, the controller 44 can, for example, calculate the sum of a numerical index of the frequency of error occurrence, etc. multiplied by an appropriate weight, and the resulting sum can be used as the priority.

For example, when a collision occurs, an abnormality such as an increase in position deviation is detected simultaneously for multiple motors which drive joints. On the other hand, for example, if the cable of a certain motor is disconnected, an abnormality will be detected only for that motor. The system may store such assumed abnormality detection patterns in advance, calculate the similarity between the actual abnormality detection pattern and the assumed abnormality detection pattern when an abnormality occurs, and display in priority the troubleshooting contents for the abnormality corresponding to the assumed abnormality detection pattern with the high similarity. As the abnormality detection pattern, a combination of occurrence/non-occurrence of multiple detection items (position deviation, speed deviation, etc.) may be used, or detected values such as the current value of a certain motor when an abnormality occurs may be used. For example, when a combination of occurrence/non-occurrence of multiple detection items is used as an abnormality detection pattern, the number of occurrence/non-occurrence combinations of multiple detection items that match may be used as the similarity. In this case, some detection items may be weighted to increase the effect on the similarity of important detection items.

The above configuration makes it easier to identify and handle the cause of the error. In addition, by making the work records registered by the user also the target of display on the error handling support screen 88, it becomes possible to handle errors based on the accumulation of knowledge acquired through past handling, and such knowledge can be shared by multiple persons. Related items are displayed in order of priority, so that errors that have occurred can be handled efficiently.

Figure 7:
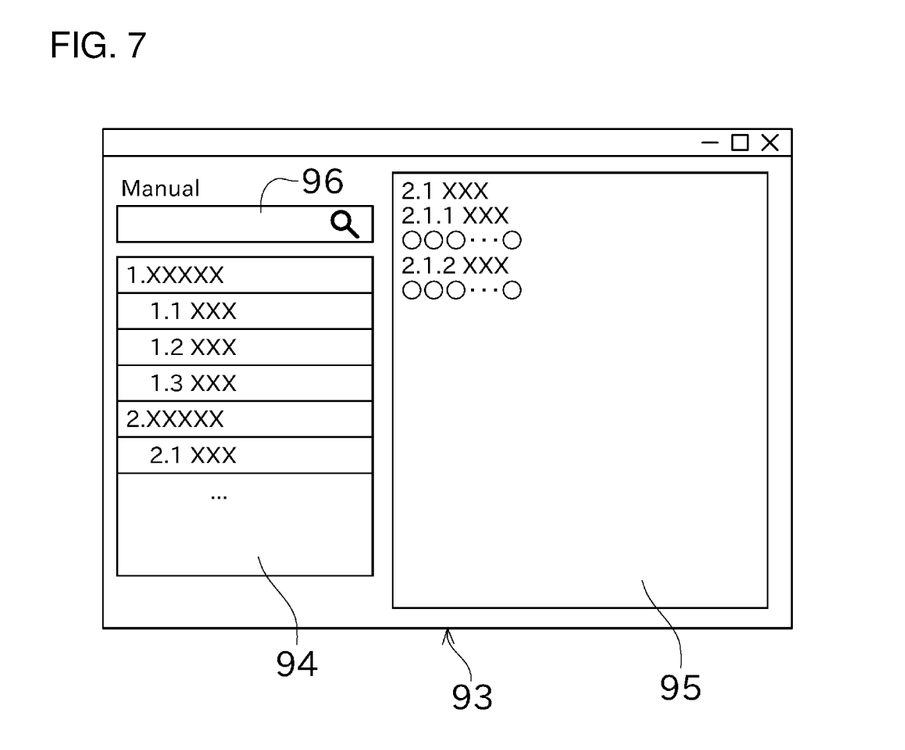
FIG. 7 is a diagram showing a display example of a manual screen.

The storage circuit 46 of the controller 44 stores methods for identifying the cause of the error, documents describing how to handle with the error, and a manual describing how to use the robot. By operating the user interface device according to the situation, the user can make these documents and manuals displayed on the display 68 for reference, as shown in FIG. 7.

A manual screen 93 is briefly described below. On the left side of the manual screen 93, a table of contents display area 94 is located. In the table of contents display area 94, the items of the table of contents of the manual are displayed in list form. On the right side of the manual screen 93, a detailed display area 95 is located. In this detailed display area 95, the specific contents of the manual corresponding to the item of the table of contents selected in the table of contents display area 94 can be displayed. A search box 96 is located above the table of contents display area 94, allowing text searches to be performed on text data of the manual. This eliminates the need to bring the paper manual closer to the robot 27.

The display of each of the log analysis screen 81, the error handling support screen 88, and the manual screen 93 is realized by the collaboration of the web server application previously installed in the controller 44 and the web browser application previously installed in the handling computer 70. By starting a web browser and operating the web browser on the handling computer 70, the above-mentioned log analysis screen 81, the error handling support screen 88, and the manual screen 93 can be displayed on the display 68, for example, in the form of web pages or the like.

The handling computer 70 for viewing the various screens (in other words, a terminal to the controller 44) can be prepared separately from the higher-level controller 61. In any case, a web browser application is installed on the viewing computer. The web server of the controller 44 determines the contents for display from the contents which are stored in the storage circuit 46 in response to a request from the web browser of the viewing computer, and transmits various data such as HTML data. The web browser on the viewing computer renders a screen such as a web page based on the various data received. In this configuration, the operator only needs to prepare an appropriate terminal with a general web browser application installed as the viewing computer, and the functions of the log analysis screen 81, the error handling support screen 88, and the manual screen 93 can be used. Thus, in this embodiment, there is no need to install special software such as a dedicated application on the terminal. Therefore, this configuration is suitable for semiconductor manufacturing plants, etc., where the bringing in of electronic equipment is generally strictly restricted and a high level of confidentiality measures are required for the electronic equipment brought in.

As explained above, in this embodiment, the video confirmation computer 65 for confirming the video related to the operation of the robot 27, includes the storage circuit 66 and the computing circuit 67. The storage circuit 66 is capable of storing information. The computing circuit 67 outputs information based on the stored contents of the storage circuit 66. The storage circuit 66 stores information of the position of the electric motor that drives the link body of the robot 27 and information of the video. The information of the position of the electric motor is received from the controller 44 of the robot 27. The information of the video is obtained by the camera 62 attached to the robot 27. The computing circuit 67 makes the display provided with the video confirmation computer 65 itself display the model area 72 and the video area 73 side by side. In the model area 72, a two-dimensional or three-dimensional model reproducing the posture of the robot 27 is displayed by computer graphics. In the video area 73, a video is displayed.

The two areas are displayed side by side in such a way, therefore, the operator can understand the situation regarding the operation of the robot 27 in a composite and intuitive manner Thus, the operator can smoothly and accurately handle the situation (for example, occurrence of an error).

In the video confirmation computer 65 of this embodiment, the time corresponding to the model displayed in the model area 72 and the time corresponding to the video displayed in the video area 73 are synchronized.

This allows the reproduction of the model operation in the model area 72 and the play of the video in the video area 73 to be synchronized. Thus, the operator viewing the screen can easily grasp the situation.

In the video confirmation computer 65 of this embodiment, the storage circuit 66 also stores the communication log in which the controller 44 communicated with other devices. In addition to the model area 72 and the video area 73, the computing circuit 67 also makes the log area 74 where the history of the communication log is output be displayed on the video confirmation computer 65 itself. The timing of displaying the history of the communication log in the log area 74 is synchronized with the time in the model area 72 and the video area 73.

As a result, changes in the display of the log area 74 are timed to be consistent with the times represented by the model area 72 and the video area 73. Thus, the operator is not confused in understanding the situation.

In the video confirmation computer 65 of this embodiment, the common seek bar 72a for specifying the time corresponding to the model displayed in the model area 72 and for specifying the time corresponding to the video displayed in the video area 73 is displayed by the computing circuit 67.

This allows the operator to specify, by intuitive operation using the seek bar, at which time the situation is to be displayed in the model area 72 and the video area 73. Thus, the operator can easily grasp the situation at the time he/she wants to know. In addition, since the seek bar 72a is common, a simplified screen can be realized that is less confusing during operation.

While some preferred embodiments of the present invention have been described above, the foregoing configurations may be modified, for example, as follows.

The information in the normal state of the robot 27 may be stored in at least one of the storage circuit 66 of the video confirmation computer 65 and the storage circuit 46 of the controller 44. In this case, when an error occurs, the information in the normal state can be displayed for reference in the video confirmation computer 65 or in the handling computer 70. This configuration is particularly advantageous in the graph area 75 in the status confirmation screen 71 displayed by the video confirmation computer 65. This is because the graph in the graph area 75 can vary greatly even in normal state, and it is difficult to distinguish between abnormal and normal conditions without a basis for comparison. Parameters that characterize the graph in normal state (for example, average value, maximum value, minimum value, or the like) can also be displayed in the graph in the graph area 75.

The computer displaying at least any of the log analysis screen 81, the error handling support screen 88, and the manual screen 93 may be a teach pendant that is operated to perform teaching operation on the robot 27.

Images obtained by the camera 62 attached to the robot 27 may also be used by the teach pendant to assist in performing the teaching operation.

The video confirmation computer 65 and the handling computer 70 may be realized in one hardware (computer).

The status confirmation screen 71 displayed by the video confirmation computer 65 may be displayed in the same browser-based manner as the log analysis screen 81 or the like.

The video confirmation computer 65 can display the status confirmation screen 71 on the display of another computer connected to the video confirmation computer 65 instead of, or in addition to, the display of the video confirmation computer 65 itself.

DESCRIPTION OF THE REFERENCE NUMERALS

27 Robot
44 Controller (robot controller)
65 Video confirmation computer
66 Storage circuit (storage unit)
67 Computing circuit (processor)
68 Display (display unit)
72 Model area
73 Video area
74 Log area

The invention claimed is:

1. A video confirmation computer for confirming a condition of a substrate shown in a video of operation performed by a robot, the video confirmation computer comprising:
   a storage unit capable of storing information; and
   a processor that outputs information based on stored contents of the storage unit, wherein
   the storage unit stores:
   information of a position of an electric motor that drives a link body of the robot received from a controller of the robot; and
   information of the video obtained by a camera attached to the robot by being fixed to the link body to which a robot hand capable of holding the substrate is fixed, the information of the video configured to show the condition of the substrate, and the processor makes at least one of the video confirmation computer itself and a computer connected to the video confirmation computer display side by side:

a model area in which a two-dimensional or three-dimensional model reproducing a posture of the robot is displayed by computer graphics; and a video area in which the video is displayed.

2. The video confirmation computer according to claim 1, wherein time corresponding to the model displayed in the model area and time corresponding to the video displayed in the video area are synchronized.

3. The video confirmation computer according to claim 2, wherein the storage unit stores a communication log in which the controller communicates with another device, in addition to the model area and the video area, the processor makes at least one of the video confirmation computer itself and the computer connected to the video confirmation computer display a log area in which history of the communication log is output, and timing of displaying the history of the communication log in the log area is synchronized with time in the model area and the video area.

4. The video confirmation computer according to claim 2, wherein the processor makes a common seek bar be displayed for specifying time corresponding to the model in the model area and time corresponding to the video displayed in the video area.

5. The video confirmation computer according to claim 1, wherein the model area comprises a control area comprising controls configured to control the display of the two-dimensional or three-dimensional model reproducing the posture of the robot by computer graphics to be reproduced or stopped in the model area and, by reproducing or stopping the display of the two-dimensional or three-dimensional model with the controls, the video is correspondingly reproduced or stopped.

* * * * *